United States Patent
Hong et al.

(10) Patent No.: US 9,900,095 B2
(45) Date of Patent: Feb. 20, 2018

(54) LIGHTING APPARATUSES AND LED MODULES FOR BOTH ILLUMINATION AND OPTICAL COMMUNICATION

(71) Applicant: EPISTAR CORPORATION, Hsinchu (TW)

(72) Inventors: Steve Meng-Yuan Hong, Hsinchu (TW); Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/493,430

(22) Filed: Apr. 21, 2017

(65) Prior Publication Data
US 2017/0287888 A1    Oct. 5, 2017

Related U.S. Application Data

(63) Continuation of application No. 14/735,572, filed on Jun. 10, 2015, now abandoned, which is a (Continued)

(51) Int. Cl.
*H04B 10/116* (2013.01)
*H05B 33/08* (2006.01)
(Continued)

(52) U.S. Cl.
CPC ............ *H04B 10/116* (2013.01); *F21V 33/00* (2013.01); *H01L 25/167* (2013.01); *H01L 33/62* (2013.01);
(Continued)

(58) Field of Classification Search
CPC .... H04B 10/00; H04B 10/116; H04B 10/516; H04B 10/5563; H04B 10/572;
(Continued)

(56) References Cited

U.S. PATENT DOCUMENTS 6,547,249 B2 * 4/2003 Collins, III ........... H01L 27/153
257/88
7,151,281 B2    12/2006 Shei et al.
(Continued)

FOREIGN PATENT DOCUMENTS

CN          1744469 A    3/2006
CN        101800219 A    8/2010
(Continued)

*Primary Examiner* — Thai Pham
(74) *Attorney, Agent, or Firm* — Muncy, Geissler, Olds & Lowe, P.C.

(57) ABSTRACT

An LED module has a controller with a modulator and illumination driver, and first and second LED chains. The first LED chain is connected to the modulator, has a first group of LED cells, and emits a first light under a pulse mode current input from the modulator. The first light has a digital data over a signal carrier. The second LED chain is connected to the illumination driver, has a second group of LED cells, and emits a second light under a constant current input from the illumination driver. There are fewer LED cells in the first group than the second group. The illumination driver is independent from the modulator in controlling emission of the first light. Alternatively, the LED module has a controller, an LED chain connected to the modulator, a first group of LED cells, and a second group of LED cells directly connected to the first group of LED cells. The first group of LED cells operates under a pulse mode current input from the modulator and emits a first light having a digital data over a signal carrier. The second group of LED cells emits a second light under a constant current input from the illumination driver.

19 Claims, 10 Drawing Sheets

Related U.S. Application Data continuation of application No. 13/089,946, filed on Apr. 19, 2011, now abandoned.

(51) Int. Cl.

| | | |
|---|---|---|
| *H01L 25/16* | (2006.01) | |
| *F21V 33/00* | (2006.01) | |
| *H04B 10/516* | (2013.01) | |
| *H04B 10/572* | (2013.01) | |
| *H01L 33/62* | (2010.01) | |
| *F21Y 105/12* | (2016.01) | |
| *F21Y 105/10* | (2016.01) | |
| *F21Y 115/10* | (2016.01) | |
| *F21Y 113/13* | (2016.01) | |

(52) U.S. Cl.
CPC ......... *H04B 10/516* (2013.01); *H04B 10/572* (2013.01); *H05B 33/0818* (2013.01); *F21Y 2105/10* (2016.08); *F21Y 2105/12* (2016.08); *F21Y 2113/13* (2016.08); *F21Y 2115/10* (2016.08); *H01L 2924/0002* (2013.01)

(58) Field of Classification Search
CPC ....... H01L 25/16; H01L 25/167; H01L 33/62; H05B 33/08; H05B 33/0818; H05B 33/0845

See application file for complete search history.

(56) References Cited

U.S. PATENT DOCUMENTS

| | | | |
|---|---|---|---|
| 7,560,738 B2 | 7/2009 | Liu | |
| 7,880,182 B2 | 2/2011 | Yao et al. | |
| 8,258,714 B2* | 9/2012 | Liu | H05B 33/0818 315/210 |
| 2002/0142504 A1 | 10/2002 | Feldman | |
| 2003/0178627 A1 | 9/2003 | Marchi et al. | |
| 2006/0044652 A1 | 3/2006 | Yamamoto | |
| 2008/0074872 A1 | 3/2008 | Panotopoulos | |
| 2008/0138085 A1* | 6/2008 | Lin | H04B 10/1149 398/172 |
| 2008/0179603 A1* | 7/2008 | Sakai | H01L 33/38 257/88 |
| 2008/0211421 A1* | 9/2008 | Lee | H05B 33/0806 315/250 |
| 2011/0080108 A1 | 4/2011 | Chiang et al. | |
| 2011/0089444 A1 | 4/2011 | Yao et al. | |
| 2012/0049213 A1 | 3/2012 | Chen et al. | |
| 2012/0155889 A1* | 6/2012 | Kim | H04B 10/116 398/193 |

FOREIGN PATENT DOCUMENTS

| | | |
|---|---|---|
| CN | 101867412 A | 10/2010 |
| TW | M381965 U1 | 6/2010 |

* cited by examiner

LIGHTING APPARATUSES AND LED MODULES FOR BOTH ILLUMINATION AND OPTICAL COMMUNICATION

CROSS REFERENCE TO RELATED APPLICATIONS

This application is a Continuation of co-pending application Ser. No. 14/735,572, filed on Jun. 10, 2015, which is a Continuation of application Ser. No. 13/089,946, filed on Apr. 19, 2011, now abandoned, for which priority is claimed under 35 U.S.C. § 120, the entire contents of all of which are hereby incorporated by reference.

BACKGROUND

The present disclosure relates generally to optical communication and array-type light-emitting devices.

Light emitting diodes (LEDs) are an important class of solid-state devices that convert electric energy to light. They generally comprise an active layer of semiconductor material sandwiched between two oppositely-doped cladding layers. When a bias is applied across the cladding layers, electrons and holes are injected into the active layer where electrons and holes recombine to generate photons, or light. Recent advances in LEDs have resulted in highly efficient light sources that surpass the efficiency of filament-based light sources, providing light with equal or greater brightness in relation to input power.

Disadvantage of conventional LEDs used for lighting applications is that they cannot generate white light directly from their active layers. Recently, two different ways have been introduced to produce white light from conventional LEDs. One way to produce white light from conventional LEDs is to combine different wavelength of light from different LEDs. For example, white light can be produced by combining the light from red, green and blue LEDs or combining the light from blue and yellow LEDs. The other way to produce white light is using yellow phosphor, polymer or dye to downconvert portion of the light from a blue LED into yellow light. A white LED is seemly produced because it simultaneously emits both blue and yellow light, which combine to provide white light.

Since white LEDs are developed, LEDs have widely used because of their high durability, longevity, portability, low power consumption, absence of harmful substances such as mercury, and so forth. Often-seen applications of LEDs include white light illumination, indicator lights, vehicle signal and illuminating light, LCD backlight modules, projector light sources, outdoor displays, and so forth. Nevertheless, other applications might use LEDs to replace their light sources.

SUMMARY

Embodiments of the present invention disclose a lighting apparatus capable of simultaneously providing illumination and data transmission to a receiver. The lighting apparatus comprises an LED module and a modulator. The LED module comprises a plurality of LED cells connected as an LED chain having two conductive pads. The light emitted from the LED module is visible. The modulator provides driving current to the LED module to transmit data.

Embodiments of the present invention disclose an LED module, comprising LEDs and conductive pads. A first group of the LED cells is connected as a first LED chain, driven for illumination. A second group of the LED cells is connected as a second LED chain for data transmission. The conductive pads include a first pair of conductive pads connected to the first LED chain and a second pair of conductive pads connected to the second LED chain.

BRIEF DESCRIPTION OF THE DRAWINGS

The invention can be more fully understood by the subsequent detailed description and examples with references made to the accompanying drawings, wherein:

FIG. 2 exemplifies light apparatus 12a;

DETAILED DESCRIPTION

The following embodiments are described in sufficient detail to enable those skilled in the art to make and use the invention. It is to be understood that other embodiments would be evident based on the present disclosure, and that proves or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

One embodiment of the invention employs LED cells as a light source to transmit digital information over a free space optical data pathway at the same time when LED cells functions for illumination. Transmission is accomplished by modulating or varying the current flowing through LED cells.

Figure 1:
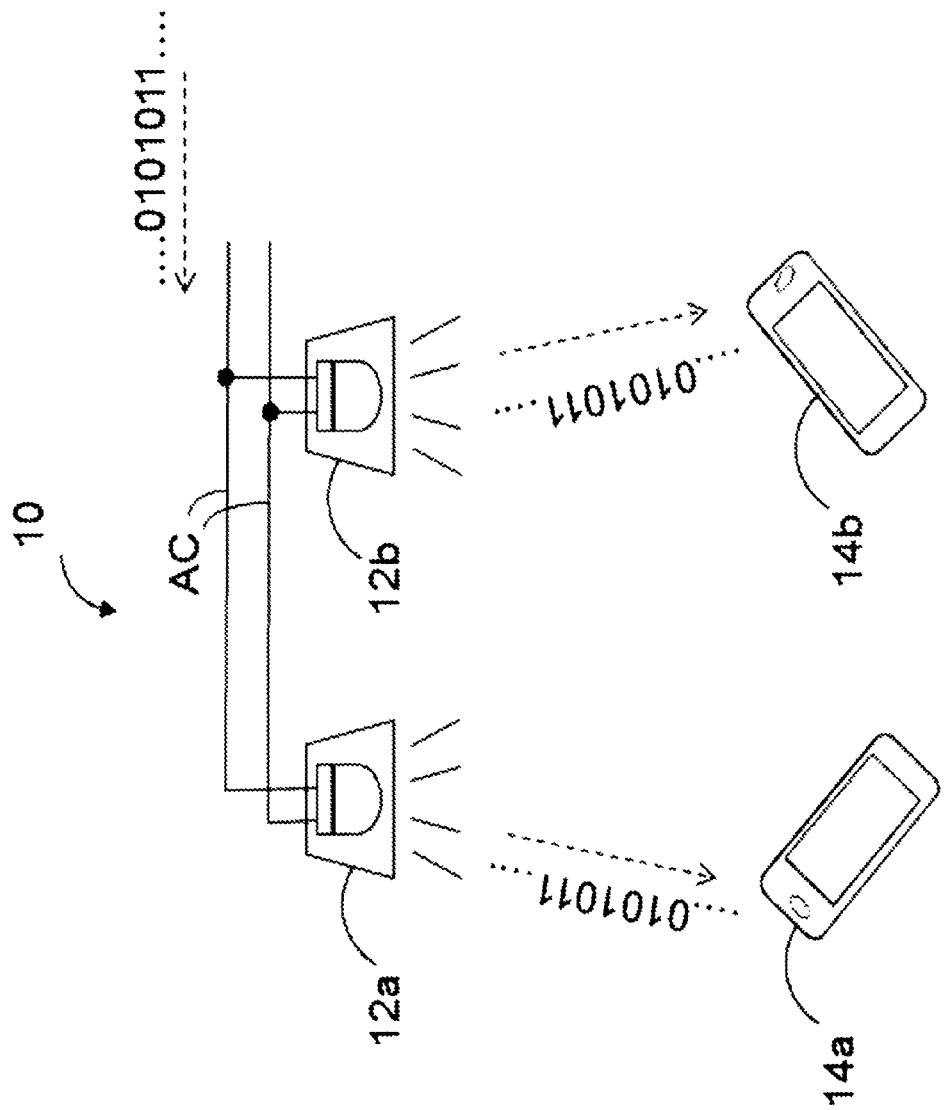
FIG. 1 illustrates a broadcast system.

FIG. 1 illustrates broadcast system 10 with light apparatuses 12a and 12b according to one embodiment of the invention. Light apparatuses 12a and 12b are powered by AC grid power lines and optionally receive digital data over AC grid power lines by way of power line communication. Each of light apparatuses 12a and 12b has an LED module with at least one LED chip. By modulating the light emitted from the LED chips, each of light apparatuses 12a and 12b transmits the digital data over the air to receiver 14a or 14b. The modulation should be over a signal carrier with an adequately-high frequency and be imperceptible by a human eye.

Subject to other factors, the data transmission rate from the AC power lines to receiver 14a or 14b is limited by the signal bandwidth that the LED chips in light apparatuses 12a and 12b can support. Input capacitance of each LED chip in light apparatuses 12a and 12b could strongly affect the bandwidth supported. Hereinafter, input capacitance of an LED chain refers to the capacitance measured from two conductive pads respectively connected to n-type and p-type contact layers of the LED chain, by means of small-signal response. The less input capacitance of an LED chip, the broader bandwidth the LED chip can support.

Figure 2:
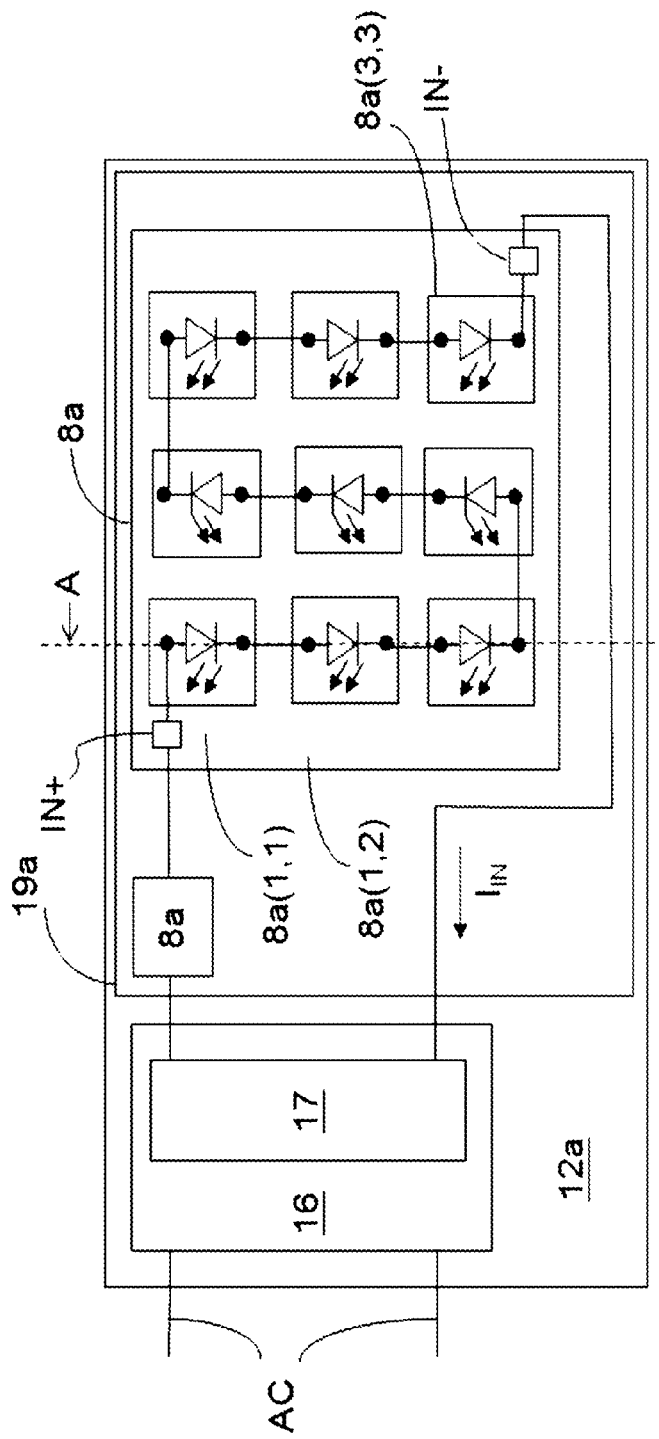

FIG. 2 exemplifies light apparatus 12a. As shown in FIG. 2, light apparatus 12a has modem 16 and LED module 19a including LED chips 8a. Modem 16, powered by AC grid power lines, is the combination of a demodulator which retrieves data carried from AC grid power lines, and a modulator 17 which provides and modulates driving current $I_{IN}$ to LED module 19a to transmit data over the emitted light. Modulator 17 might include a converter converting an AC source current to driving current $I_{IN}$. The light emitted from the LED chips 8a is a visible light, for example a blue light having a wavelength spectrum around 440~480 nm, a green light having a wavelength spectrum around 500~560 nm, a green light having a wavelength spectrum around 500~560 nm, a red light having a wavelength spectrum around 600~650 nm, or white light. In the embodiment of FIG. 2, LED module 19a has two LED chips 8a connected in series. For another embodiment, an LED module might have only one LED chip.

As an example, LED chip 8a has LED cells 8a(1,1)~8a(3,3), arranged as an LED array with 3 columns and 3 rows. Label WW(N, M) refers to the LED cell located at $N^{th}$ column and $M^{th}$ row of LED chip WW. LED cells 8a(1, 1)~8a(3, 3) are connected in series as an LED chain having two conductive pads IN+ and IN−, which are located at two diagonal corners of LED cells 8a(1, 1) and 8a(3, 3), respectively. The physical orientation for each LED cell in $1^{st}$ and $3^{rd}$ column is opposite to that of each LED cell in $2^{nd}$ column. If one LED cell in an LED chain is forward biased, all LED cells in the LED chain are forward biased, and vice versa. In one embodiment, LED cells 8a(1,1)~8a(3,3) are epitaxial grown on a monolithic substrate through MOCVD process and other semiconductor process, such as sputtering, lithography, and etching process, such that the active layers therein are formed at the same time and made of substantially the same material. As the operation voltage of LED chip 8a is the summation of the operation voltages of individual LED cells, LED chip 8a is sometimes referred as a high-voltage (HV) LED chip. The number of the LED cells of the LED chip is around 3~80, or preferred 8~40, depending on the operation voltage to be applied.

In order to provide the function of illumination, an LED chip should have enough number of LED cells emitting at the same time. LED cells connected in parallel could emit light at the same time, but the input capacitance for the LED cells as a whole increases as the number of the LED cells increases. Supposed that there are K1 identical LED cells connected in parallel and each individual LED cell has input capacitance of F farad, the capacitance of the LED cells as a whole will be K1*F farad. As mentioned before, increased input capacitance might reduce the bandwidth and the data transmission rate, such that LED cells connected in parallel are not suitable for data communication. Nevertheless, LED cells connected in series as an LED chain emit at the same time, and the input capacitance for the LED cells as a whole decreases as the number of the LED cells connected in series increases. The input capacitance for K1 identical LED cells as a whole will be F/K1 farad if they are connected in series wherein each individual one has input capacitance of F farad. Thus, an LED chain is suitable for both illumination and data transmission. In the embodiment of FIG. 2, a driven LED chain has a plurality of LED cells connected in series, the number of the LED cells is around 3~80, or preferred 8~40.

There is another advantage that series connection surpasses parallel connection. Each and every LED in an LED chain of an LED chip will be driven with the same driving current even if there are slight differences between the characteristics of the LED cells in the LED chain. In other words, the LED cells in an LED chain of an LED chip emit power evenly. LED cells connected in parallel acts differently, however. Most of the driving current for the LED cells connected in parallel crowds to the LED cell with the least resistance, such that the LED cell with the least resistance emits higher power in comparison with others, therefore downgrading the reliability of the LED chip.

Figure 3:
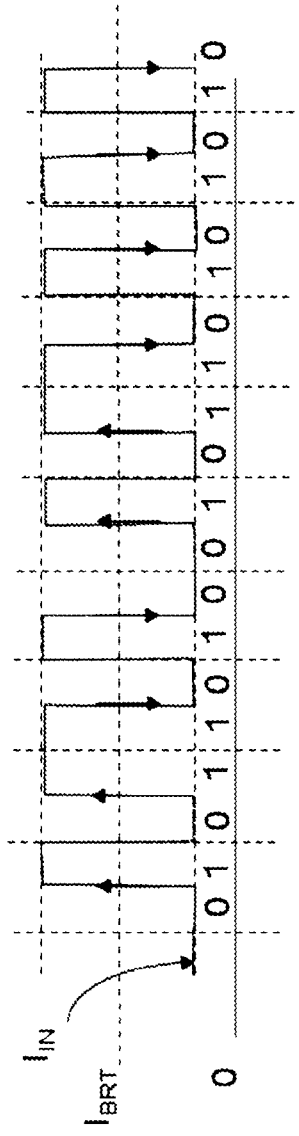
FIG. 3 shows the waveform of driving current $I_{IN}$ that a modem provides to the LED module of FIG. 2.

FIG. 3 shows the waveform of driving current $I_{IN}$ that modem 16 could provide to LED module 19a of FIG. 2. Driving current $I_{IN}$ substantially switches between a high current level and a low current level back and forth. The low current level (of logic 0) is no less than 0 A and could be as low as 0 A, forcing LED module 19a to stop emitting. The high current level (of logic 1) drives LED module 19a to emit visible light. Within a clock cycle time, a rising edge means data "1" while a falling edge means data "0". This kind of encoding scheme is called Manchester coding, a special case of binary phase shift keying. The data transmission rate should exceed the frequency range perceivable by a human eye, such that LED module 19a is seen by human eyes to illuminate without flickering and provide constant intensity of light as being driven by average current $I_{BRT}$, which is the average of the high and low current levels.

Figure 4:
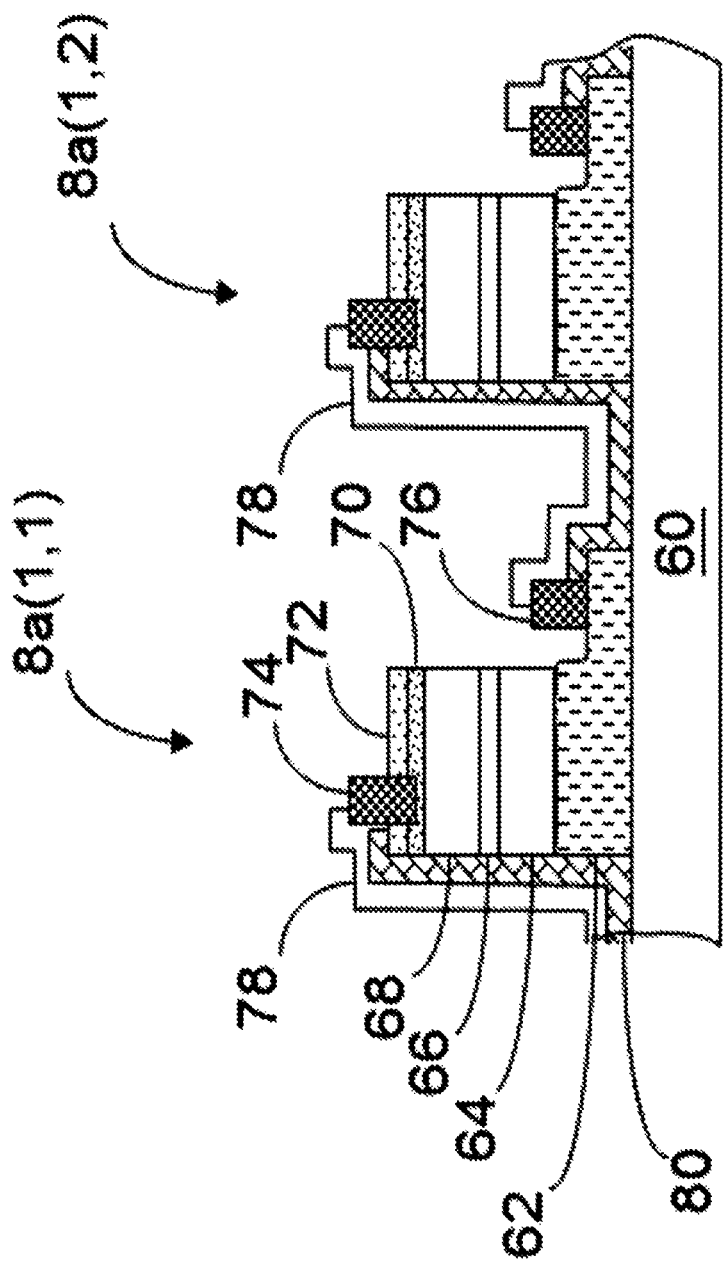
FIG. 4 demonstrates a cross section view of LED cells 8a(1, 1) and 8a(1, 2), cutting along the dotted line AA' in FIG. 2.

As an example, FIG. 4 demonstrates a cross section view of LED cells 8a(1, 1) and 8a(1, 2), cutting along the dotted line AA' in FIG. 2. A similar drawing has been published in FIG. 2 of US Patent Application Publication 2010/0213474, whose entirety is incorporated by reference. As shown in FIG. 4, LED cells 8a(1, 1) and 8a(1, 2) are grown on a monolithic substrate 60, each having, from bottom to top, n-type contact layer 62, n-type cladding layer 64, active layer 66, p-type cladding layer 68, and p-type contact layer 70. A wavelength conversion layer 72 is optionally formed on contact layer 70 to convert the light emitting from the active layer. Two electrodes 76 and 74 are optionally formed (may be omitted) on n-type contact layer 62 and p-type contact layer 70, respectively. LED cells 8a(1, 1) and 8a(1, 2) are physically separated on monolithic substrate by a trench between LED cells 8a(1, 1) and 8a(1, 2). An electric circuit layer 78 provides electric connection between the n-type contact layer 62 of 8a(1,1) and the p-type contact layer 70 of the adjacent LED cell, such as 8a(1,2) to form a series connection. An insulator layer 80 is formed under portion of electric circuit layer 78 to prevent unwanted short circuits. In one embodiment, each of LED cells 8a(1, 1) to 8a(3, 3) occupies a cell area on the monolithic substrate 60 no more than 121 mil². The monolithic substrate 60 has a surface area, for example between $1.21*10^2$ to $1*10^5$ mil².

Two conductive pads IN−, IN+ are provided for electric connection between the LED chip 8a and an electric circuit outside the chip through external wires. The two conductive pads IN−, IN+ are respectively formed on the monolithic substrate 60 outside the array area for LED cells 8a(1,1)~8a(1,3), and preferably at different corners or borders of the LED chip 8a. The conductive pads IN−, IN+ are electrically coupled to the LED cells 8a(1,1)~8a(1,3) via the electric circuit layer 78 as in FIG. 4.

As LED cells 8a(1,1)~8a(3,3) are epitaxial grown on monolithic substrate 60 using MOCVD process and other semiconductor process, such as sputtering, lithography, and etching process, the compositions of the active layers 66 therein are substantially the same to emit lights with the same or similar wavelength spectrum. Nevertheless, wavelength conversion layers 72 may be different or absent for some LED cells. For example, in one embodiment, all LED cells 8a(1,1)~8a(3,3) are white LED cells each having an active layer emitting blue light and a wavelength conversion layer downconverting the blue light into yellow light. In another embodiment, some of LED cells 8a(1,1)~8a(3,3) are white LED cells each having a wavelength conversion layer downconverting the blue light into yellow light, and others are blue LED cells having a wavelength conversion layer downconverting the blue light into red light. In another embodiment, some of LED cells 8a(1,1)~8a(3,3) are white LED cells each having a wavelength conversion layer and others are blue LED cells having no wavelength conversion layer. In one embodiment, the wavelength conversion layer is formed a layered structure bonded to the contact layer through a glue bonding layer under chip process for the foregoing embodiments. In another embodiment, the wavelength conversion layer is formed by encapsulating the LED chip by an encapsulating material containing a wavelength conversion material under packaging process.

Figure 5:
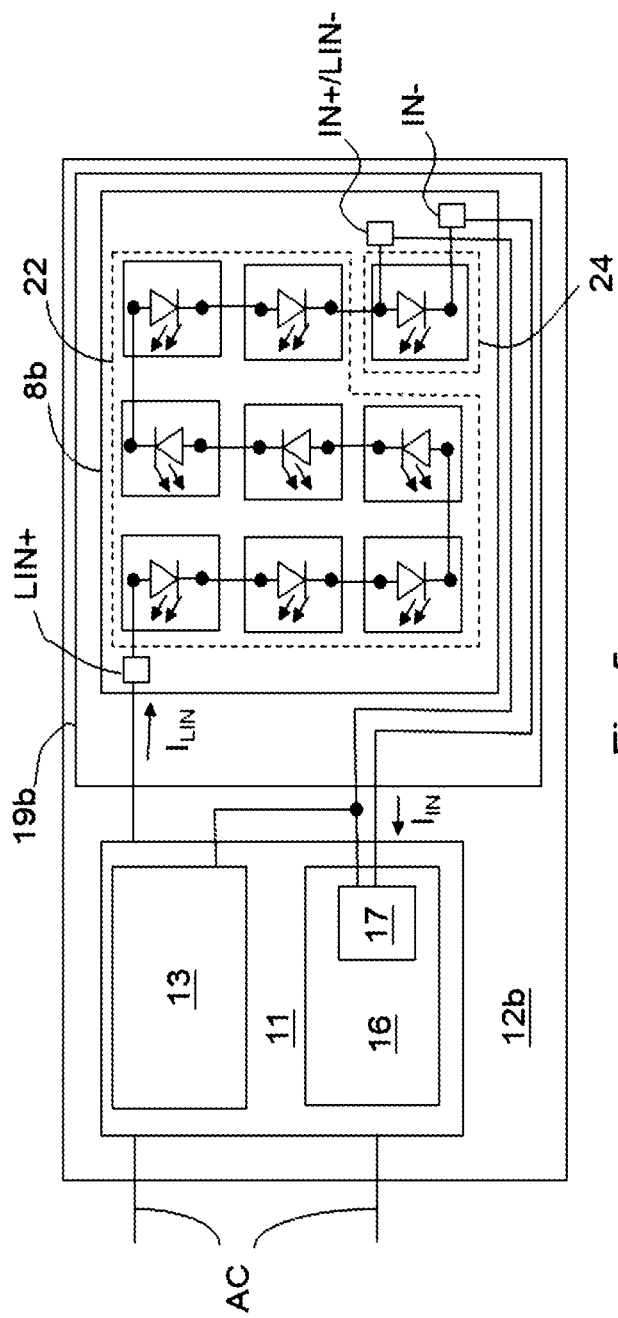
FIG. 5 exemplifies another light apparatus.
Figure 6:
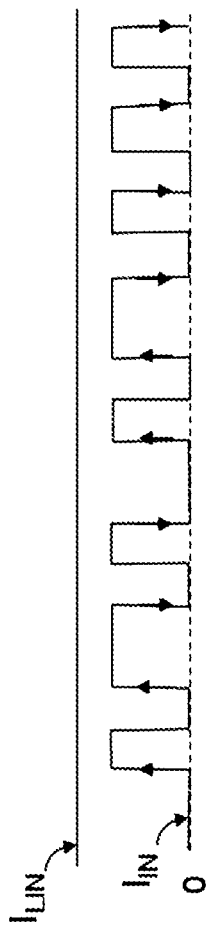
FIG. 6 shows the waveform of driving current $I_{IN}$ and $I_{LIN}$ that the modulator and the illumination driver of FIG. 5 provide respectively.

FIG. 5 exemplifies light apparatus 12b. LED module 19b is controlled by controller 11 to provide both illumination and data transmission. Similar with LED chip 8a of FIG. 2, LED chip 8b in LED module 19b has LED cells 8b(1,1)~8b(3,3), arranged as an LED array on a monolithic substrate. LED chip 8b is slightly different with LED chip 8a. While LED chip 8a of FIG. 2 has only one LED chain with one pair of conductive pads IN+ and IN− as inputs, LED chip 8b of FIG. 5 has two LED chains 22 and 24. The number of LED cells in one LED chain is not restricted and one LED chain might include only one LED cell as exemplified by LED chain 24, or more than one LED cell. LED chain 22 has a pair of conductive pads LIN+ and IN+/LIN− while LED chain 24 has a pair of conductive pads IN+/LIN− and IN−. It can be found conductive pad IN+/LIN− is a common conductive pad connected to both the anode (or the n-type contact layer) of LED chains 24 and the cathode (or the p-type contact layer) of LED chain 22. Conductive pads LIN+, IN−, and IN+/LIN− are provided for electric connection between the LED chip 8a and an electric circuit outside the chip through external wires. The conductive pads LIN+, IN−, and IN+/LIN− are respectively formed on the monolithic substrate 60 outside the area of the LED cells of LED chip 8b, and preferred at different corners or borders of the LED chip 8b as shown in FIG. 5. The conductive pads LIN+, IN−, and IN+/LIN− are electrically coupled to the LED cells via the electric circuit layer 78 as in FIG. 4. For example, pad IN+/LIN− is connected via electric circuit layer 78 to both a p-type contact layer of LED chain 24 and a n-type contact layer of LED chain 22. The pair of conductive pads LIN+ and IN+/LIN− is connected to illumination driver 13 of controller 11 and the pair of conductive pads IN+/LIN− and IN− is connected to modulator 17 of controller 11. FIG. 6 shows the waveform of driving current $I_{IN}$ and $I_{LIN}$ respectively provided by modulator 17 and illumination driver 13 of FIG. 5. The operation of modulator 17 is not detailed here for brevity since it has been done in the paragraphs regarding with FIGS. 2 and 3. It is comprehensive that LED chain 24 driven by modulator 17 transmits data via the light it emits. Illumination driver 13 of FIG. 5 provides driving current $I_{LIN}$ to LED chain 22. Driving current $L_{LIN}$ is almost a constant and conveys no data as shown in FIG. 6, such that LED chain 22 only acts as a lighting source for illumination. Accordingly, LED chip 8b has two LED chains 22 and 24 where LED chain 22 is only for illumination and LED chain 24 is for data transmission.

In one embodiment, LED chip 8b is formed on a monolithic substrate, each of LED cells 8b(1, 1) to 8b(3, 3) occupies a cell area on a monolithic substrate no more than 121 mil$^2$, and the number of LED cells in LED chain 24 is smaller than that in LED chain 22. In another embodiment, the area of one of the LED cell(s) in LED chain 24 for data transmission is smaller than that in LED chain 22 for illumination. In one embodiment, the area of one of the LED cell(s) for data transmission is preferred no more than 121 mil$^2$, and the area of one of the LED cells for illumination is preferred no more than 400 mil$^2$.

In one embodiment, LED chains 22 and 24 emit light of different colors. For example, LED cells in chain 22 comprises white LED cells and LED cell 8b(3,3) in chain 24 is a blue LED cell.

Figure 7:
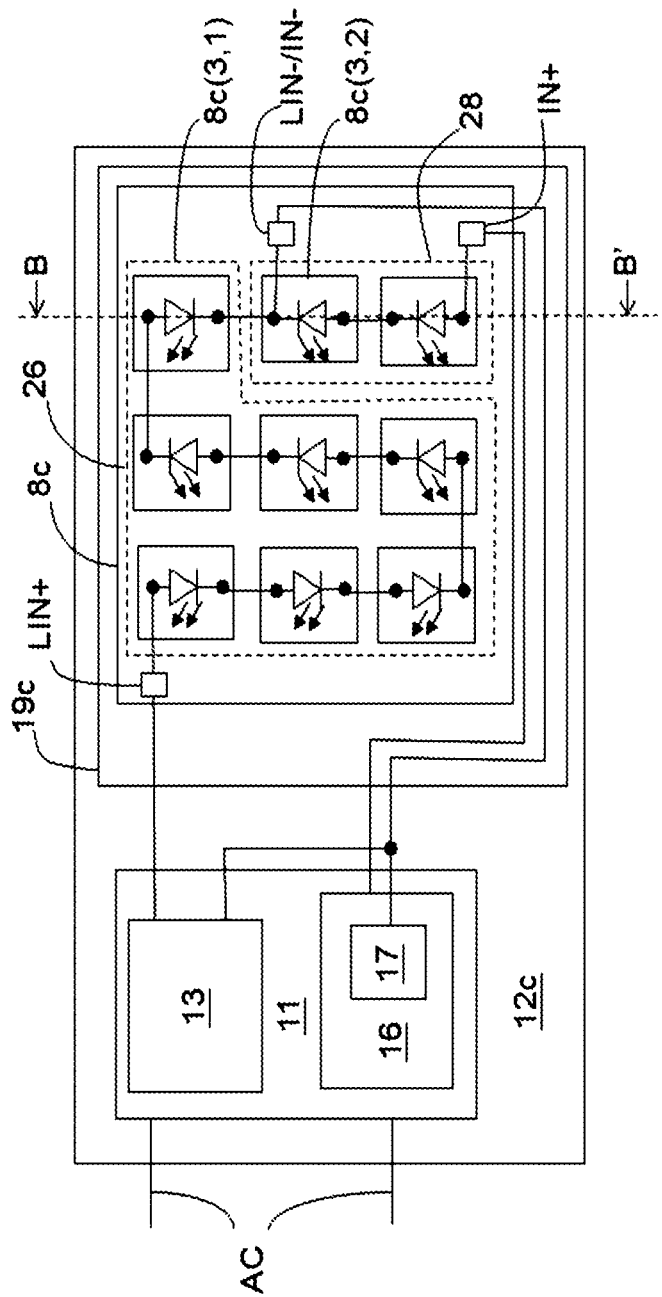
FIG. 7 exemplifies another light apparatus.
Figure 8:
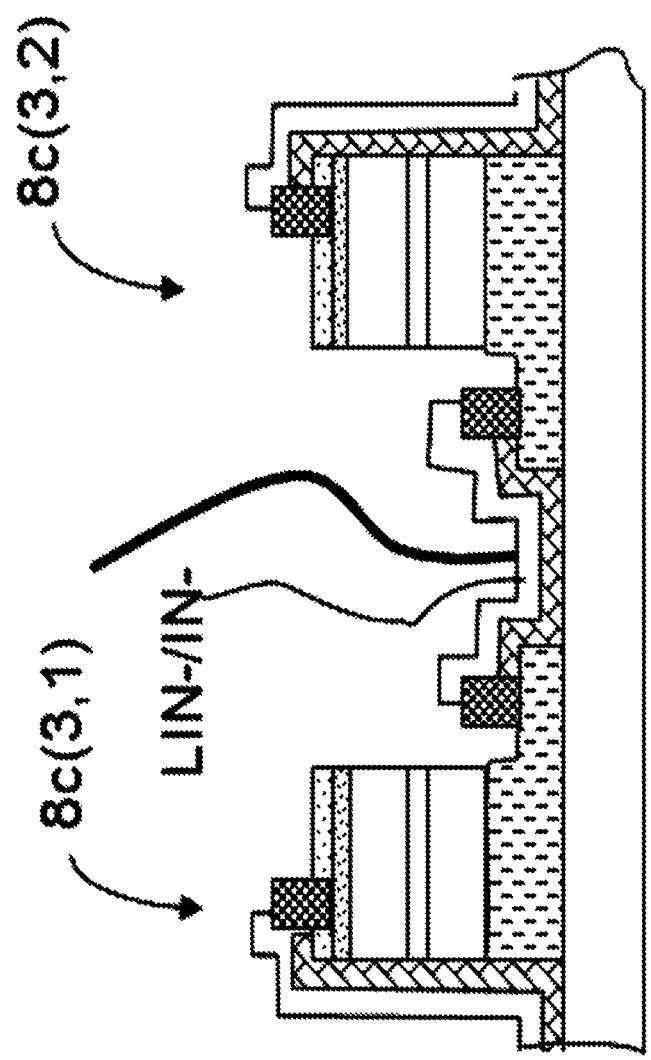
FIG. 8 demonstrates a cross section view of LED cells 8c(3, 1) and 8c(3, 2) in FIG. 7, cutting along the dotted line BB'.

FIG. 7 exemplifies light apparatus 12c. Similar with LED chip 8b of FIG. 5, LED chip 8c of FIG. 7 has two LED chains 26 and 28. LED chain 26 is only for illumination, driven via a pair of conductive pads LIN+ and LIN−/IN− by illumination driver 13. LED chain 28 is for data transmission, driven via a pair of conductive pads IN+ and LIN−/IN− by modulator 17. The conductive pad LIN−/IN− is electrically connected to both two n-type contact layers of LED chains 26 and 28. In one embodiment, LED chip 8c is formed on a monolithic substrate. FIG. 8 demonstrates a cross section view of LED cells 8c(3, 1) and 8c(3, 2) in FIG. 7, cutting along the dotted line BB'. As shown in FIG. 8, even though they are located in the same column, LED cell 8c(3, 1), which belongs to LED chain 26, has a cell orientation opposite to LED cell 8c(3, 2), which belongs to LED chain 28.

Figure 9:
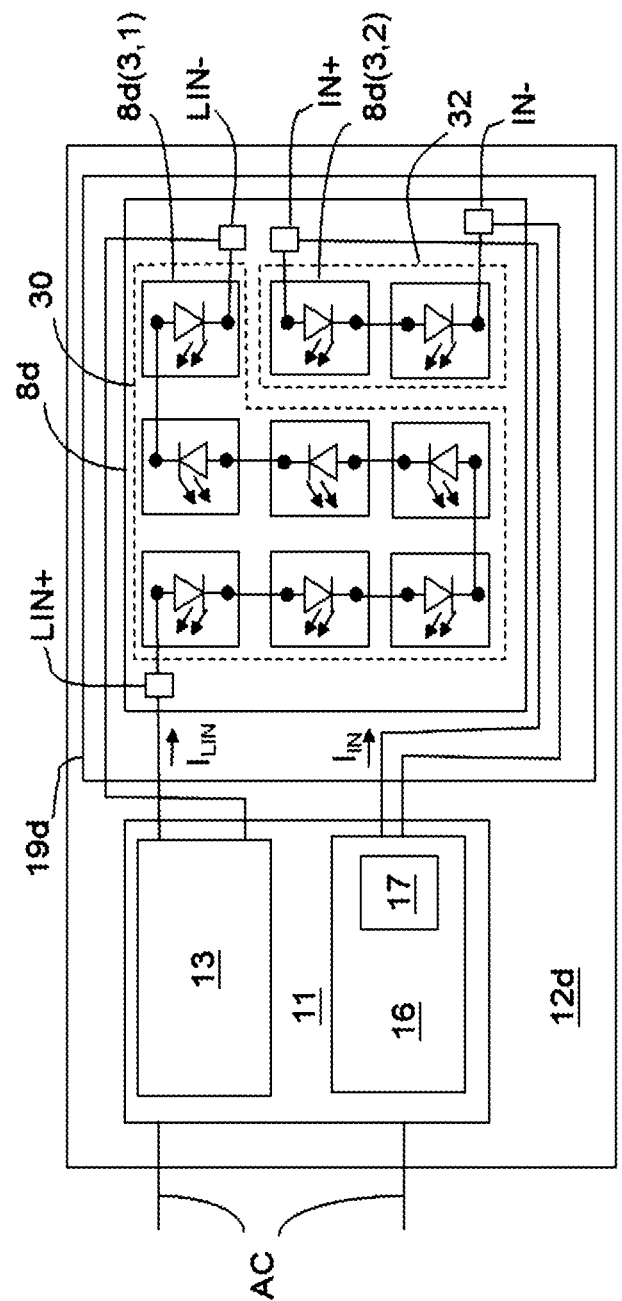
FIGS. 9-12 exemplify four light apparatuses.
Figure 10:
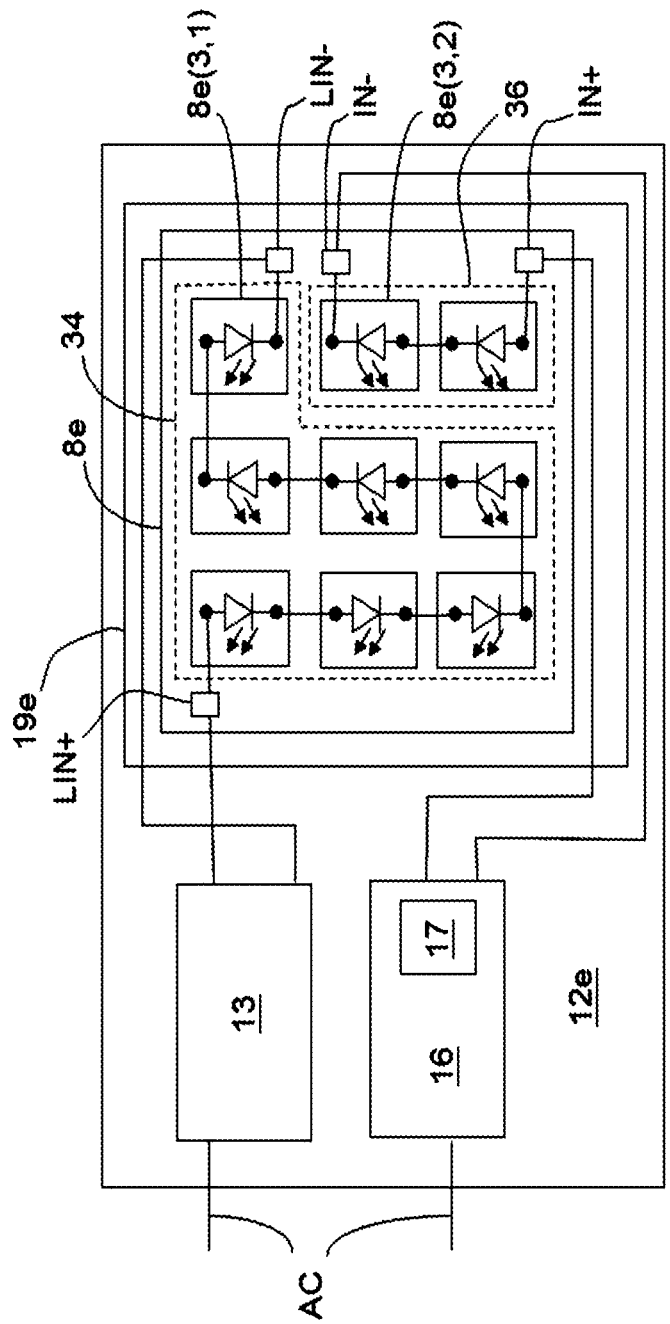

It is unnecessary that the LED chain only for illumination must shares a common conductive pad with the LED chain for data transmission. FIGS. 9 and 10 exemplify light apparatuses 12d and 12e. In FIG. 9, LED chip 8d has LED chain 30 only for illumination and LED chain 32 for data transmission. Conductive pads LIN+ and LIN− for LED chain 30 are independent to conductive pads IN+ and IN− for LED chain 32, while LED cell 8d(3, 1) has the same cell orientation with LED cell 8d(3, 2). LED chains 30 and 32 are electrically insulated on the monolithic substrate. In FIG. 10, LED chip 8e has LED chain 34 only for illumination and LED chain 36 for data transmission, while LED cell 8e(3, 1) has a cell orientation opposite to LED cell 8e(3, 2).

Figure 11:
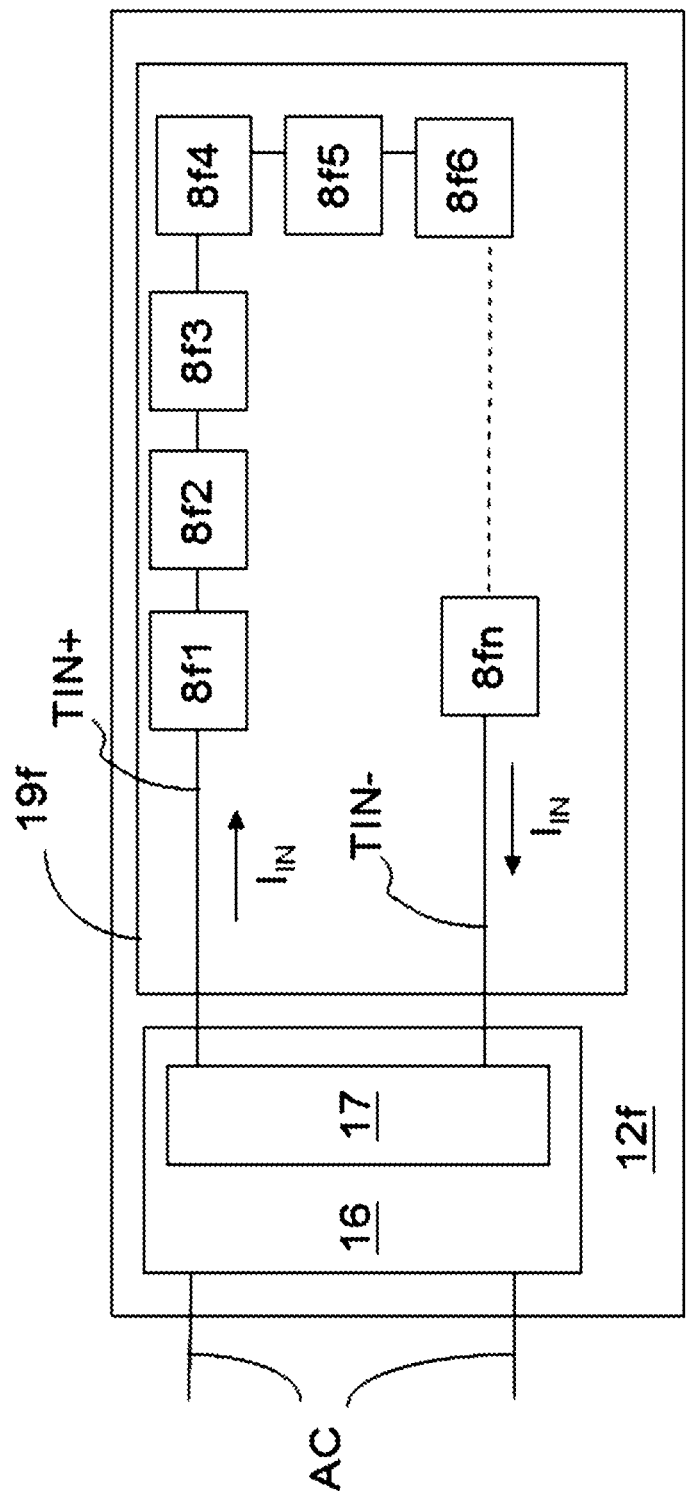

FIG. 11 exemplifies light apparatus 12f. It is unnecessary that LED cells in an LED module are all monolithically formed as an array on a monolithic substrate. In FIG. 11, LED module 19f has individual LED chips 8f1 to 8fn, where n is an integer. LED chips 8f1 to 8fn could be formed on different substrates individually and together packaged on a submount, where the data transmitting speed would be lower compared with the LED module as disclosed in the foregoing embodiments using a monolithically-formed LED cell array on a single chip. In one embodiment, LED chips 8f1 to 8fn are all white LED chips. In another embodiment, LED chips 8f1 to 8fn consist of red, green and blue LED chips. LED module 19f has two conductive terminals TIN+ and TIN−, through which modulator 17 provides driving current $I_{IN}$ to LED cells 8f1 to 8fn to transmit data.

Figure 12:
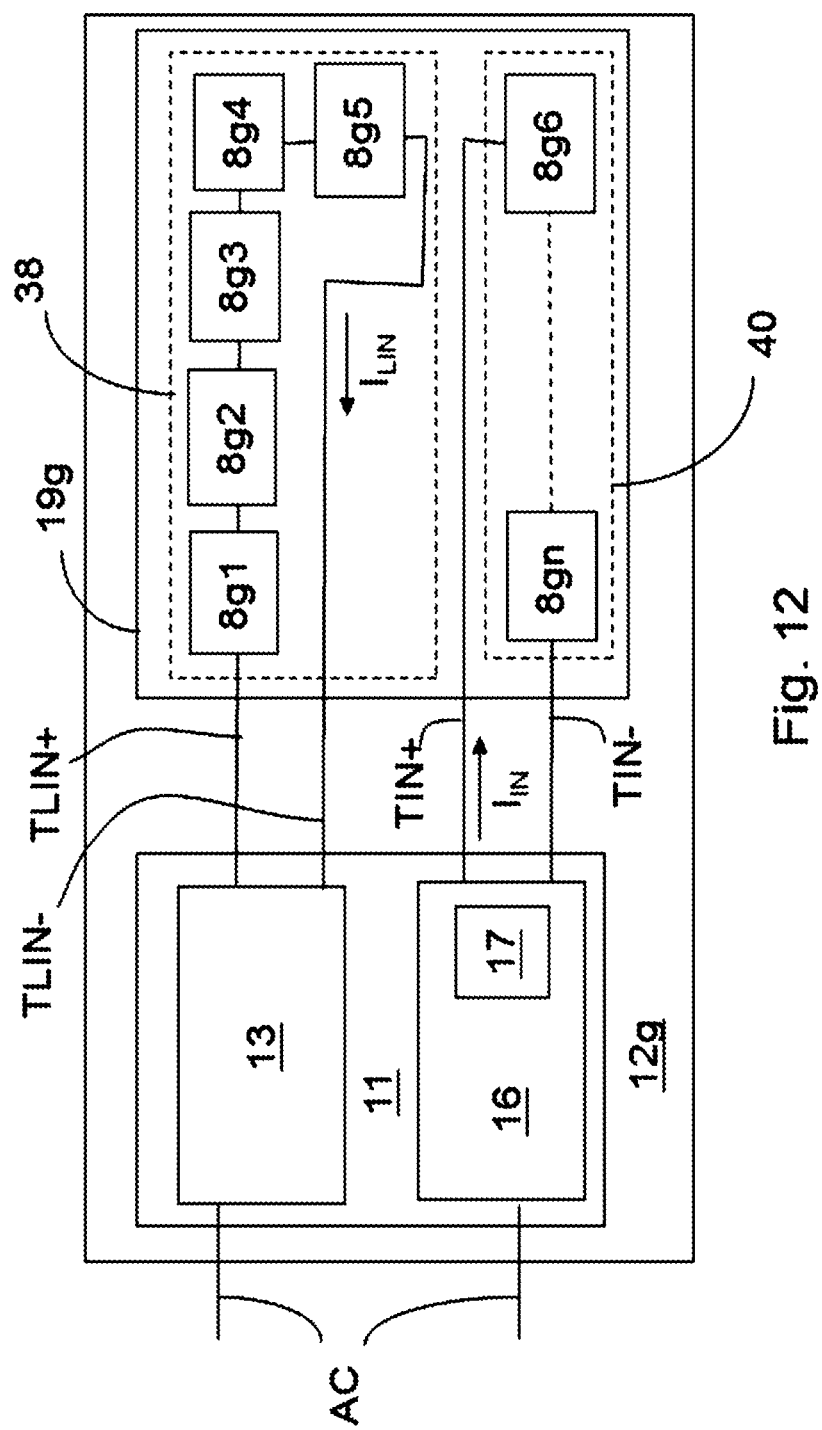

FIG. 12 exemplifies light apparatus 12g. Similar with FIG. 11, LED module 19g of FIG. 12 has LED chips 8g1 to 8gn, where n is an integer. LED chips 8g1 to 8g5 are grouped and connected as LED chain 38, driven by illumination driver 13 and functioning only for illumination. LED chips 8g6 to 8gn are grouped and connected as LED chain 40, driven by modulator 17 for data transmission. The light from LED chain 38 might be the same with or different to that from LED chain 40. LED chips 8g1 to 8g5 of LED chain 38 or LED chips 8g6 to 8gn of LED chain 40 comprise at least one selected from blue LED, green LED, red LED, and white LED chips. For example, LED chips 8g1 to 8g5 of LED chain 38 consist of green and red LED chips and LED chips 8g6 to 8gn consist of only blue LED chips. In one embodiment, LED chain 38 provides visible light, and LED chain 40 provides invisible light. In view of noise immunity, it is preferable that the wavelength spectrum of the light from LED chain 40 has a peak that is not affected by the intensity of the light from LED chain 38.

All the previously-mentioned LED chains that function, partially or fully, for illumination provide visible light. Nevertheless, the previously-mentioned LED chains that function only for data transmission could provide visible or invisible light.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

The invention claimed is:

1. An LED module, comprising:
   a controller comprising a modulator and an illumination driver;
   a first LED chain, connected to the modulator, comprising a first group of LED cells and configured to emit a first light under a pulse mode current input from the modulator, wherein the first light comprises a digital data over a signal carrier; and
   a second LED chain, connected to the illumination driver, comprising a second group of LED cells, and configured to emit a second light under a constant current input from the illumination driver,
   wherein the first group of LED cells is less than the second group of LED cells in quantity, and
   wherein the illumination driver is independent from the modulator in controlling an emission of the first light.

2. The LED module of claim 1, further comprising first conductive pads connected to the first LED chain and second conductive pads connected to the second LED chain, wherein the first conductive pads and the second conductive pads share a common conductive pad.

3. The LED module of claim 2, wherein the first LED chain comprises a p-type contact layer, the second LED chain comprises an n-type contact layer, the p-type contact layer and the n-type contact layer are electrically coupled to the common conductive pad under which an insulating layer is formed.

4. The LED module of claim 1, wherein the first LED chain comprises a first LED chip formed on a first corner of the LED module, the second LED chain comprises a second LED chip formed on a second corner of the LED module, and the second corner is symmetrical to the first corner with respect to a central line of the LED module.

5. The LED module of claim 1, wherein the first LED chain is capable of emitting a color light which is different from that emitted from the second LED chain.

6. The LED module of claim 1, wherein the first LED chain comprises at least one LED cell capable of emitting a color light different from that emitted from another LED cell in the second LED chain.

7. The LED module of claim 1, further comprising a substrate having an area between $1.21*10^2$ and $1*10^5$ mil$^2$.

8. The LED module of claim 1, wherein the signal carrier has a frequency imperceptible to human eyes.

9. The LED module of claim 1, wherein the LED module is capable of receiving data in a way of power line communication.

10. The LED module of claim 1, wherein the first LED chain comprises a first LED, the second LED chain comprises a second LED, wherein the second LED has an area greater than that of the first LED.

11. The LED module of claim 1, wherein the first light has a wavelength spectrum having a peak which is not affected by the second light.

12. The LED module of claim 1, wherein the illumination driver is independent from the modulator in controlling an emission of the first light or the second light.

13. The LED module of claim 1, wherein a color of the first light is different from that of the second light.

14. An LED module, comprising:
   a controller comprising a modulator and an illumination driver; and
   a LED chain connected to the modulator, and comprising a first group of LED cells and a second group of LED cells directly connected to the first group of LED cells,
   wherein the first group of LED cells is less than the second group of LED cells in quantity,
   wherein the first group of LED cells is configured to operate under a pulse mode current input from the modulator and emit a first light comprising a digital data over a signal carrier, and
   wherein the second group of LED cells is operated to emit a second light under a constant current input from the illumination driver.

15. The LED module of claim 14, wherein a color of the first light is different from that of the second light.

16. The LED module of claim 14, wherein the illumination driver is independent from the modulator in controlling an emission of the first light or the second light.

17. The LED module of claim 14, wherein the first light has a wavelength spectrum having a peak which is not affected by the second light.

18. The LED module of claim 14, wherein the signal carrier has a frequency imperceptible to human eyes.

19. The LED module of claim 14, wherein the LED module is capable of receiving data in a way of power line communication.

* * * * *